(12) United States Patent
Pang et al.

(10) Patent No.: US 12,537,531 B2
(45) Date of Patent: Jan. 27, 2026

(54) LINEARITY CALIBRATION METHOD AND APPARATUS FOR DTC, AND DIGITAL PHASE LOCK LOOP

(71) Applicant: SANECHIPS TECHNOLOGY CO., LTD., Guangdong (CN)

(72) Inventors: Rui Pang, Guangdong (CN); Faen Liu, Guangdong (CN); Wen Cao, Guangdong (CN)

(73) Assignee: SANECHIPS TECHNOLOGY CO., LTD., Guangdong (CN)

( * ) Notice: Subject to any disclaimer, the term of this patent is extended or adjusted under 35 U.S.C. 154(b) by 6 days.

(21) Appl. No.: 18/696,385

(22) PCT Filed: Sep. 19, 2022

(86) PCT No.: PCT/CN2022/119523
§ 371 (c)(1),
(2) Date: Mar. 28, 2024

(87) PCT Pub. No.: WO2023/051291
PCT Pub. Date: Apr. 6, 2023

(65) Prior Publication Data
US 2024/0380404 A1    Nov. 14, 2024

(30) Foreign Application Priority Data
Sep. 28, 2021    (CN) .......................... 202111141261.1

(51) Int. Cl.
*H03L 7/085*    (2006.01)
*H03L 7/197*    (2006.01)
(52) U.S. Cl.
CPC ............ *H03L 7/085* (2013.01); *H03L 7/1974* (2013.01)

(58) Field of Classification Search
CPC ......... H03L 7/085; H03L 7/1974; H03L 7/08; H03L 7/18; Y02D 30/70
See application file for complete search history.

(56) References Cited

U.S. PATENT DOCUMENTS 10,103,741 B2 * 10/2018 Gao ...................... H03L 7/0992
11,777,510 B2 * 10/2023 Lim ...................... H03L 7/1976
                                                              327/156

(Continued)

FOREIGN PATENT DOCUMENTS

CN       104506190 A    4/2015
CN       110350912 A    10/2019

(Continued)

OTHER PUBLICATIONS

Machine translation of CN-104506190-A (Year: 2015).*

(Continued)

*Primary Examiner* — Jean B Corrielus
(74) *Attorney, Agent, or Firm* — Li & Cai Intellectual Property (USA) Office

(57) ABSTRACT

The present disclosure provides a linearity calibration method for digital time converter, including: acquiring a phase prediction parameter and a locked phase error, and calculating a control word of a digital time converter according to the phase prediction parameter, the locked phase error, a pre-configured nonlinear predistortion function, and a pre-configured calibration order n, with the control word being configured to enable the digital time converter to adjust a delay of a reference clock, so as to keep the reference clock and a feedback clock which are input to a time digital converter in a tracked state. The present disclosure further provides a linearity calibration apparatus for digital time converter and a digital phase lock loop.

13 Claims, 10 Drawing Sheets

(56) References Cited

U.S. PATENT DOCUMENTS 11,870,449 B2 * 1/2024 Banin ..................... G06F 1/08
2017/0019115 A1   1/2017 Van Den Heuvel

FOREIGN PATENT DOCUMENTS

CN   112803944 A    5/2021
EP    2339753 A1 *  6/2011  ............. H03L 7/081

OTHER PUBLICATIONS

Machine translation of CN-112100789-A (Year: 2020).*
Machine translation of DE 102014105824 (Year: 2014).*
WIPO, International Search Report issued on Nov. 29, 2022.

* cited by examiner

LINEARITY CALIBRATION METHOD AND APPARATUS FOR DTC, AND DIGITAL PHASE LOCK LOOP

CROSS REFERENCE TO RELATED APPLICATIONS

The present disclosure is a National Phase Application filed under 35 U.S.C. 371 as a national stage of PCT/CN2022/119523, filed on Sep. 19, 2022, an application claiming the priority to Chinese Patent Application No. CN202111141261.1 entitled "LINEARITY CALIBRATION METHOD AND APPARATUS FOR DTC, AND DIGITAL PHASE LOCK LOOP" and filed on Sep. 28, 2021, the contents of which are incorporated herein by reference in their entirety.

TECHNICAL FIELD

The present disclosure relates to the technical field of digital circuits, and in particular, to a linearity calibration method and apparatus for Digital Time Converter (DTC), and a digital phase lock loop.

BACKGROUND

The 6th-generation wireless technology standard 802.11ax supports a modulation and demodulation mode of 1024 Quadrature Amplitude Modulation (QAM), and an Error Vector Magnitude (EVM) index of −35 dB of the 1024 QAM proposes a high requirement on clock quality and brings a great challenge to implementation of a clock circuit. When a conventional phase lock loop is used to produce a clock meeting such high quality requirement, the production hits a performance bottleneck, which urgently needs to be solved by new architecture and new circuit techniques.

Compared with a conventional Analog Phase Lock Loop (APLL), a Digital Phase Lock Loop (DPLL) has higher freedom in design and bandwidth configuration of a loop filter, and integral noise of a DPLL output clock can be adjusted to an optimal level through selection of appropriate loop parameters. In addition, a full-digital implementation method of the DPLL further provides feasibility for increasing various digital calibration techniques, and those calibration techniques can effectively improve phase lock loop (PLL) performance. The DPLL has significant advantages in terms of area and performance over the APLL under advanced processes. Therefore, replacing the APLL with the DPLL as a high performance clock source will become a trend of clock evolution in the future, but also causes new problems.

SUMMARY

An embodiment of the present disclosure provides a linearity calibration method for DTC, including: acquiring a phase prediction parameter and a locked phase error; and calculating a control word of a DTC according to the phase prediction parameter, the locked phase error, a pre-configured nonlinear predistortion function, and a pre-configured calibration order n, wherein n is an integer greater than or equal to 2, and the control word is configured to enable the DTC to adjust a delay of a reference clock so as to keep the reference clock and a feedback clock which are input to a Time Digital Converter (TDC) in a tracked state.

An embodiment of the present disclosure further provides a linearity calibration apparatus for DTC, including a processing module and a configuration module; the configuration module is configured to configure a nonlinear predistortion function and a calibration order n for the processing module, wherein n is an integer greater than or equal to 2; and the processing module is configured to: acquire a phase prediction parameter and a locked phase error, and calculate a control word of a DTC according to the phase prediction parameter, the locked phase error, the pre-configured nonlinear predistortion function, and the pre-configured calibration order n, wherein the control word is configured to enable the DTC to adjust a delay of a reference clock so as to keep the reference clock and a feedback clock which are input to a TDC in a tracked state.

An embodiment of the present disclosure further provides a digital phase lock loop, including a quantization error accumulation device, a DTC, a TDC, and the linearity calibration apparatus for DTC provided by the present disclosure, the linearity calibration apparatus for DTC is respectively connected to the quantization error accumulation device and the DTC, and the TDC is connected to the DTC; the quantization error accumulation device is configured to generate a phase prediction parameter according to an input fractional frequency division ratio; the linearity calibration apparatus for DTC is configured to calculate a control word of a DTC according to the phase prediction parameter, a locked phase error, a pre-configured nonlinear predistortion function, and a pre-configured calibration order n; and the DTC is configured to adjust a delay of a reference clock according to the control word so as to keep the reference clock and a feedback clock which are input to the TDC in a tracked state.

DETAIL DESCRIPTION OF EMBODIMENTS

Figure 1:
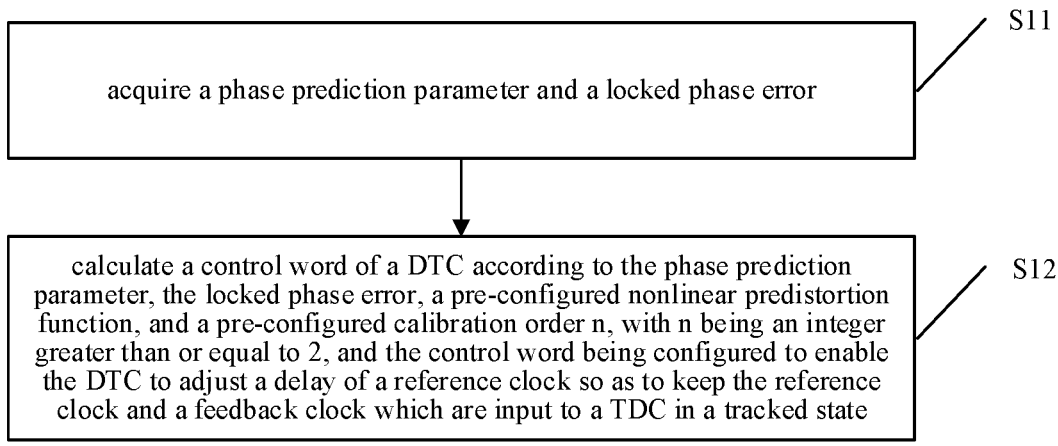
FIG. 1 is a flowchart illustrating of a linearity calibration method for DTC according to the present disclosure.

Exemplary embodiments of the present disclosure will be described more fully below with reference to the drawings, but the exemplary embodiments described herein may be embodied in different forms and should not be interpreted as being limited to embodiments described herein. The embodiments are provided to make the present disclosure thorough and complete, and are intended to enable those of ordinary skill in the art to fully understand the scope of the present disclosure.

The term "and/or" used herein includes one associated listed item or any and all combinations of more than one associated listed items.

The terms used herein are merely used to describe specific embodiments, and are not intended to limit the present disclosure. As used herein, "a" and "the" which indicate a singular form are intended to include a plural form, unless expressly stated in the context. It should be further understood that the term(s) "comprise" and/or "be made of" used herein indicate(s) the presence of the described features, integers, operations, elements and/or components, but do not exclude the presence or addition of one or more other features, integers, operations, elements, components and/or combinations thereof.

The embodiments of the present disclosure can be described with reference to plans and/or cross-sectional views with the aid of idealized schematic diagrams of the present disclosure. Accordingly, the exemplary drawings may be modified according to manufacturing techniques and/or tolerances. The embodiments are not limited to those illustrated by the drawings, but include modifications to configuration formed based on a manufacturing process. Thus, regions shown in the drawings are illustrative, and shapes of the regions shown in the drawings illustrate specific shapes of regions of elements, but are not intended to make limitations.

Unless otherwise defined, all terms (including technical and scientific terms) used herein have the same meaning as commonly understood by those of ordinary skill in the art. It should be further understood that terms, such as those defined in commonly used dictionaries, should be interpreted as having a meaning that is consistent with a meaning in the context of the related technology and the background of the present disclosure, and should not be interpreted in an idealized or overly formal sense unless expressly so defined herein.

A high performance DPLL mainly uses a TDC as a phase discriminator, and a dynamic range of the TDC is generally up to more than one clock cycle of a Digital-Controlled Oscillator (DCO) in a fractional mode. For the DPLL, resolution of the TDC can directly affect in-band noise performance, and therefore, the resolution of the TDC in the high performance DPLL needs to reach a picosecond (ps) level. In order to ensure the dynamic range, the number of orders of the TDC must be increased, but linearity of the phase discriminator is restricted by the excessively large number of the orders of the TDC. Thus, the resolution of the TDC and the linearity of the TDC are difficult to reconcile. For the DPLL, a phase error between a reference clock and a feedback clock can be adjusted to a small range through phase prediction and a DTC, so that the requirement on the dynamic range of the TDC is reduced, and the linearity is ensured. However, the introduced DTC also has a nonlinearity problem, which may cause a mismatch of a phase adjustment value, resulting in problems of spurious and noise.

An integer PLL takes a reference frequency as an output clock frequency step and frequency resolution realized by the integer PLL is dozens of megahertz or even hundreds of megahertz, so that the integer PLL cannot meet requirements of a local oscillator clock in a modern communication system. By adding a sigma-delta modulator (SDM), a fractional PLL can break the direct relationship between the reference clock frequency and the frequency step and reduce the frequency resolution to a hertz level, and fractional frequency division is a necessary function of current PLLs. Due to the use of quantization means and noise shaping technology, the fractional PLL has a high requirement on linearity of a loop module. The problems of spurious and in-band noise caused by nonlinearity are main reasons for poorer performance of the fractional PLL relative to the integer PLL. In general, linearity of a PLL is mainly restricted by a phase discriminator circuit, the nonlinearity problem of a phase frequency detector of the APLL becomes more serious at a zero-point position, and the phase frequency detector of the APLL may be optimized merely through circuit optimization and layout adjustment. Similar to the APLL, the linearity of the phase discriminator of the DPLL also affects performance of the PLL output clock. In view of the above, the embodiments of the present disclosure provide a linearity calibration method and apparatus for DTC, which are applicable to the DPLL.

Figure 5:
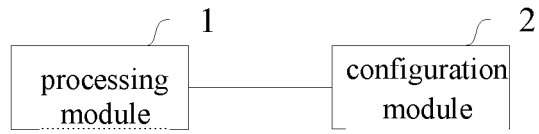
FIG. 5 is a schematic structural diagram of a linearity calibration apparatus for DTC according to the present disclosure.
Figure 6:
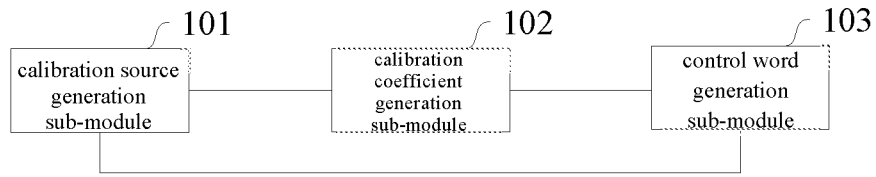
FIG. 6 is another schematic structural diagram of a linearity calibration apparatus for DTC according to the present disclosure.

An embodiment of the present disclosure provides a linearity calibration method for DTC, which is applied to a linearity calibration apparatus for DTC, and the linearity calibration apparatus for DTC may be disposed in a DPLL. A structure of the linearity calibration apparatus for DTC is shown in FIG. 5 and FIG. 6, and may include a processing module 1 and a configuration module 2. The configuration module 2 is configured to configure a nonlinear predistortion function and a calibration order n for the processing module 1, and the processing module 1 includes a calibration source generation sub-module 101, a calibration coefficient generation sub-module 102, and a control word generation sub-module 103. The calibration source generation sub-module 101 is connected to the calibration coefficient generation sub-module 102 and the control word generation sub-module 103, and the calibration coefficient generation sub-module 102 is connected to the control word generation sub-module 103. The calibration source generation sub-module 101 is configured to generate high-order calibration sources, and send the high-order calibration sources to the calibration coefficient generation module 102 and the control word generation module 103. The calibration coefficient generation module 102 is configured to generate calibration coefficients in one-to-one correspondence with the high-order calibration sources. The control word generation module 103 is configured to generate a control word of a DTC according to the high-order calibration sources and the calibration coefficients corresponding thereto, so as to enable the DTC to adjust a delay of a reference clock according to the control word, thereby keeping the reference clock and a feedback clock which are input to a TDC in a tracked state.

As shown in FIG. 1, the linearity calibration method for DTC according to the present disclosure includes the following operations S11 and S12.

At operation S11, acquiring a phase prediction parameter and a locked phase error.

Locked phase error PHE=integer phase difference PHI between reference clock and feedback clock+fractional phase difference PHF between reference clock and feedback clock.

At operation S12, calculating a control word of a DTC according to the phase prediction parameter, the locked phase error, a pre-configured nonlinear predistortion function, and a pre-configured calibration order n, with n being an integer greater than or equal to 2, and the control word being configured to enable the DTC to adjust a delay of a reference clock so as to keep the reference clock and a feedback clock which are input to the TDC in a tracked state.

The nonlinear predistortion function is a higher-order function and has a calibration order n greater than or equal to 2, and the calibration order n is the order of the nonlinear predistortion function. The higher the order of the nonlinear predistortion function is, the better the compensation effect for nonlinearity of the DTC is, and the more the digital resources to be consumed is. The calibration order of the nonlinear predistortion function may be selected with the configuration module 2 to reach a compromise between consumption of the digital resources and a calibration effect.

According to the linearity calibration method for DTC provided by the present disclosure, by constructing a higher-order function to perform reverse compensation on the nonlinear predistortion function of an analog DTC, the DTC can be controlled to accurately adjust a phase of the reference clock, phase synchronization of the reference clock and the feedback clock can be kept, a mismatch of a phase adjustment value caused by nonlinearity of the DTC can be eliminated, and the problems of spurious and noise caused by the nonlinearity of the DTC can be suppressed; compared with a first-order piecewise fitting method, the nonlinear predistortion function has a faster convergence speed and can produce a better nonlinearity cancellation effect; and by adopting a full-digital predistortion method to analyze and compensate for the nonlinearity of the DTC, a design of an analog DTC circuit does not need to be improved, a complex digital-to-analog interface is avoided, the method is not sensitive to Process, Voltage, and Temperature (PVT) changes, and high circuit reliability and consistency can be realized.

In the related technology, nonlinearity calibration of a DTC is generally performed with a method based on foreground calibration, so as to improve a differential nonlinearity (DNL) of the DTC. The foreground calibration method needs to be performed after a chip is powered on, which affects establishment time of normal work of the chip; and the foreground calibration method needs large-scale data sampling and complex cooperation of digital circuits and analog circuits, and is low in efficiency and high in cost. In addition, the foreground calibration method cannot solve the problem of nonlinearity of the chip caused by changes of operating voltage and temperature, resulting in a poor linearity calibration effect.

In order to solve the above problems, the present disclosure adopts a background calibration method.

Figure 2:
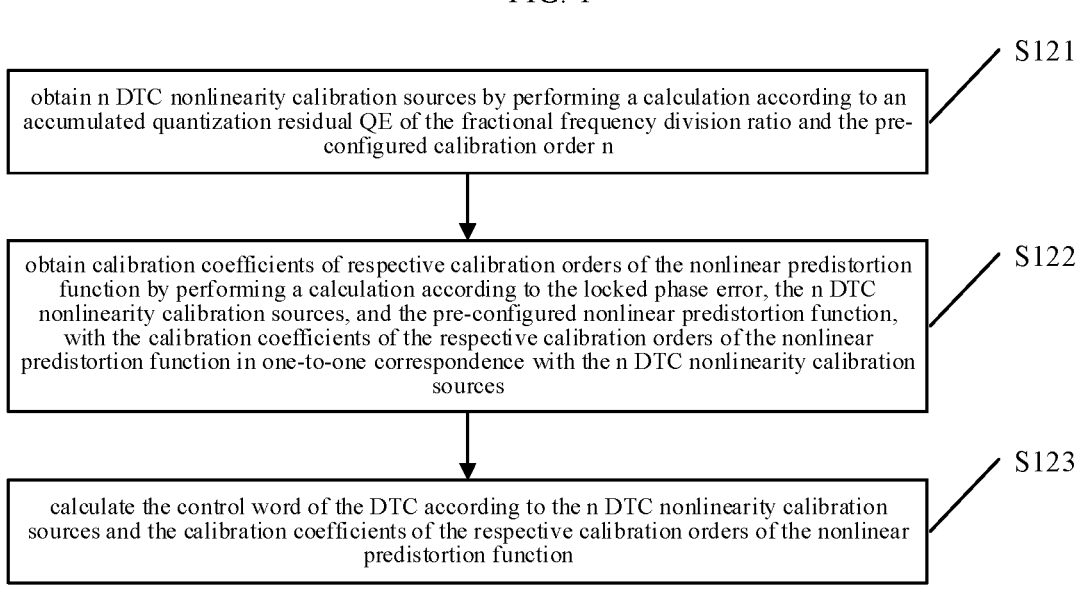
FIG. 2 is a flowchart of calculating a control word of a DTC according to the present disclosure.

The phase prediction parameter at least includes an accumulated quantization residual QE of a fractional frequency division ratio. Correspondingly, as shown in FIG. 2 and FIG. 6, calculating the control word of the DTC according to the phase prediction parameter, the locked phase error, the pre-configured nonlinear predistortion function, and the pre-configured calibration order n (i.e., the operation S12) may include the following operations S121 to S123.

At operation S121, obtaining n DTC nonlinearity calibration sources by performing a calculation according to the accumulated quantization residual QE of the fractional frequency division ratio and the pre-configured calibration order n.

At the operation S121, the calibration source generation sub-module 101 performs a calculation according to the input accumulated quantization residual QE of the fractional frequency division ratio and the calibration order n configured by the configuration module 2 to obtain the n DTC nonlinearity calibration sources X1 to Xn, and respectively inputs the n DTC nonlinearity calibration sources X1 to Xn to the calibration coefficient generation sub-module 102 and the control word generation sub-module 103.

At operation S122, obtaining calibration coefficients of respective calibration orders of the nonlinear predistortion function by performing a calculation according to the locked phase error, the n DTC nonlinearity calibration sources, and the pre-configured nonlinear predistortion function, with the calibration coefficients of the respective calibration orders of the nonlinear predistortion function in one-to-one correspondence with the n DTC nonlinearity calibration sources.

At the operation S122, the calibration coefficient generation sub-module 102 performs a calculation according to the input n DTC nonlinearity calibration sources X1 to Xn, the locked phase error PHE, and the pre-configured nonlinear predistortion function to obtain n calibration coefficients K1 to Kn in one-to-one correspondence with the DTC nonlinearity calibration sources X1 to Xn, and inputs the calibration coefficients K1 to Kn to the control word generation sub-module 103.

At operation S123, calculating the control word of the DTC according to the n DTC nonlinearity calibration sources and the calibration coefficients of the respective calibration orders of the nonlinear predistortion function.

At the operation S123, the control word generation sub-module 103 performs a calculation according to the DTC nonlinearity calibration sources X1 to Xn and the calibration coefficients K1 to Kn to generate the control word DTC_CTRL of the DTC, and inputs the control word DTC_CTRL of the DTC to the DTC.

In the present disclosure, the full-digital predistortion method is adopted to analyze and compensate for the nonlinearity of the DTC, without involving correction of linearity of the analog DTC circuit, and therefore, design difficulty of the DTC circuit is not increased and no extra digital-to-analog interface is added; and background dynamic adjustment of the control word can be realized through real-time updating of the calibration coefficients, and according to the changes of operating voltage and temperature of the chip, the nonlinearity of the DTC can be tracked in real time and an accurate predistortion processing is performed.

Figure 3:
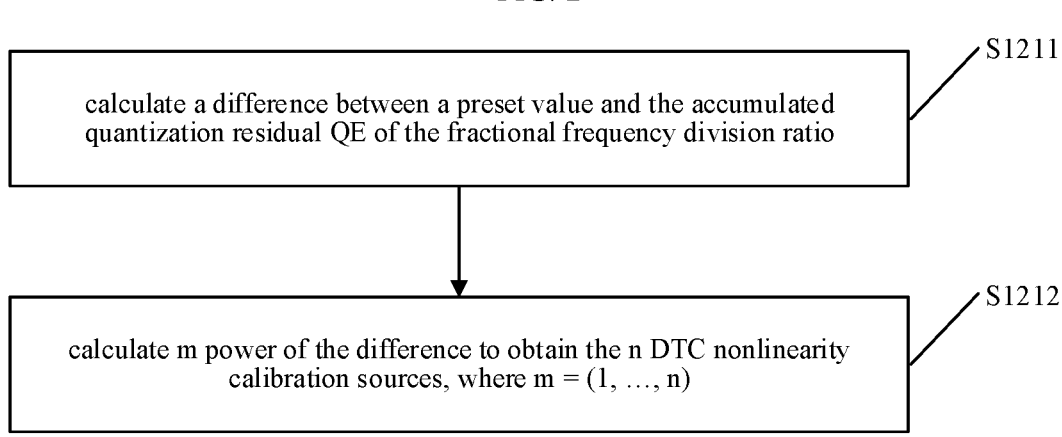
FIG. 3 is a flowchart of calculating DTC nonlinearity calibration sources according to the present disclosure.

As shown in FIG. 3, obtaining the n DTC nonlinearity calibration sources by performing a calculation according to the accumulated quantization residual QE of the fractional frequency division ratio and the pre-configured calibration order n (i.e., the operation S121) may include the following operations S1211 and S1212.

At operation S1211, calculating a difference between a preset value and the accumulated quantization residual QE of the fractional frequency division ratio.

The preset value may be 0.5. At the operation S1211, the difference D20 between the preset value and the accumulated quantization residual QE of the fractional frequency division ratio may be calculated by D20=0.5−QE.

At operation S1212, calculating m power of the difference to obtain the n DTC nonlinearity calibration sources, where $m=(1, \ldots, n)$.

At the operation S1212, first power of the difference D20 is calculated to obtain X1, second power of the difference D20 is calculated to obtain X2 . . . and n power of the difference D20 is calculated to obtain Xn, thus obtaining the n DTC nonlinearity calibration sources X1 to Xn. It should be noted that all the DTC nonlinearity calibration sources may be calculated simultaneously at the operation S1212.

Obtaining the calibration coefficients of the respective calibration orders of the nonlinear predistortion function by performing a calculation according to the locked phase error, the n DTC nonlinearity calibration sources, and the pre-configured nonlinear predistortion function (i.e., the operation S122) may include; according to the n DTC nonlinearity calibration sources X1 to Xn and the locked phase error PHE, adopting an adaptive algorithm to make the nonlinear predistortion function to converge, and performing a calculation to obtain the calibration coefficients K1 to Kn of the respective calibration orders of the nonlinear predistortion function. By iterating the coefficients of the higher-order function by the adaptive algorithm, accurate predistortion processing of the nonlinearity of the analog DTC can be realized.

The calibration coefficients K1 to Kn may be calculated by the Least Mean Squares (LMS) algorithm, the Least Squares (LS) algorithm, or the Recursive Least Squares (RLS) algorithm.

Figure 4:
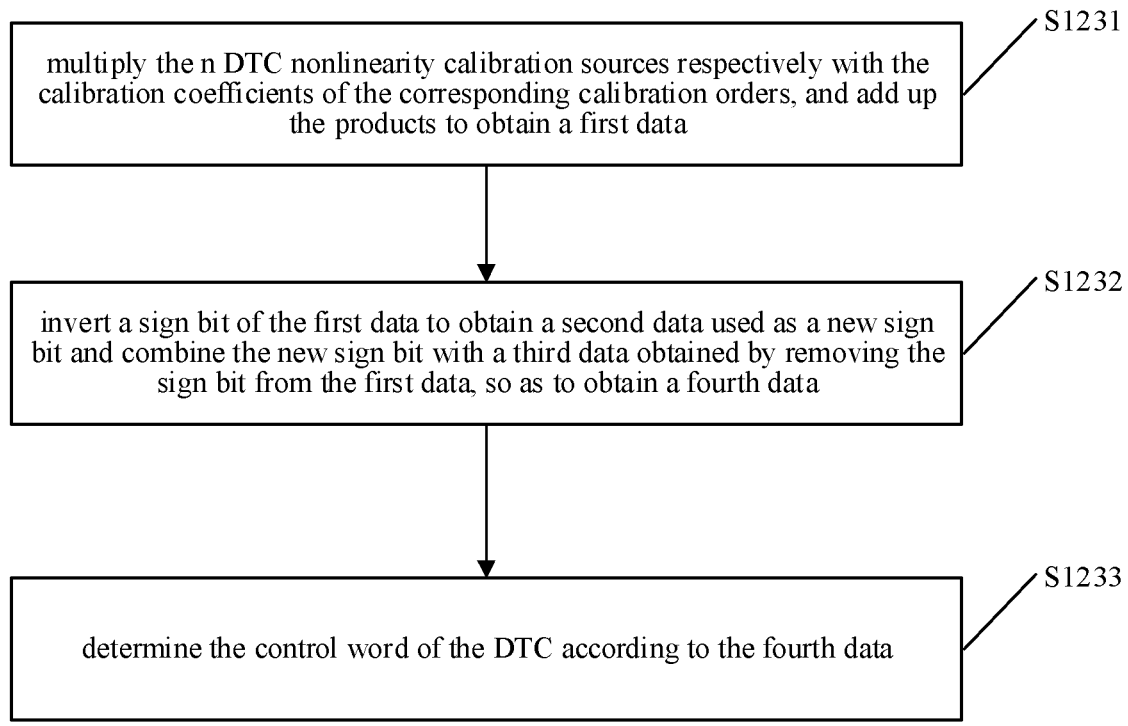
FIG. 4 is another flowchart of calculating a control word of a DTC according to the present disclosure.

As shown in FIG. 4, calculating the control word of the DTC according to the n DTC nonlinearity calibration sources and the calibration coefficients of the respective calibration orders of the nonlinear predistortion function (i.e., the operation S123) may include the following operations S1231 to S1233.

At operation S1231, multiplying the n DTC nonlinearity calibration sources respectively with the calibration coefficients of the corresponding calibration orders, and adding up the products to obtain a first data.

At the operation S1231, the DTC nonlinearity calibration sources X1 to Xn may be respectively multiplied with the calibration coefficients K1 to Kn of the corresponding calibration orders to obtain n products (D41, D42, . . . , D4n), and the n products (D41, D42, . . . , D4n) may be added up to obtain the first data D50.

At operation S1232, inverting a sign bit of the first data to obtain a second data used as a new sign bit and combining the new sign bit with a third data obtained by removing the sign bit from the first data, so as to obtain a fourth data.

At the operation S1232, the sign bit of the first data D50 is the sign bit D51, the sign bit is a Most Significant Bit (MSB) of the first data D50, and the data left after removing the sign bit D51 from the first data D50 is D53. The sign bit D51 is inverted to obtain the second data D52, and the second data D52 is combined with the third data D53 to obtain the fourth data D54.

At operation S1233, determining the control word of the DTC according to the fourth data.

At the operation S1233, the control word DTC_CTRL of the DTC may be obtained through data selection for the fourth data D54 or a preset threshold Default_val. It should be noted that the control word DTC_CTRL of the DTC is the fourth data D54 or the preset threshold Default_val.

Based on the same technical concept, an embodiment of the present disclosure further provides a linearity calibration apparatus for DTC. As shown in FIG. 5, the linearity calibration apparatus for DTC includes the processing module 1 and the configuration module 2 configured to configure a nonlinear predistortion function and a calibration order n for the processing module 1, with n being an integer greater than or equal to 2. The configuration module 2 may be configured to select the calibration order n of the nonlinear predistortion function for reaching a compromise between consumption of digital resources and a calibration effect.

The processing module 1 is configured to acquire a phase prediction parameter and a locked phase error, and calculate a control word of a DTC according to the phase prediction parameter, the locked phase error, the pre-configured nonlinear predistortion function, and the pre-configured calibration order n, where the control word is configured to enable the DTC to adjust a delay of a reference clock so as to keep the reference clock and a feedback clock which are input to a TDC in a tracked state.

The phase prediction parameter may include an accumulated quantization residual QE of a fractional frequency division ratio. As shown in FIG. 6, the processing module 1 includes the calibration source generation sub-module 101, the calibration coefficient generation sub-module 102, and the control word generation sub-module 103.

The calibration source generation sub-module 101 is connected to the calibration coefficient generation sub-module 102 and the control word generation sub-module 103, and is configured to perform a calculation according to the accumulated quantization residual QE of the fractional frequency division ratio and the pre-configured calibration order n to obtain n DTC nonlinearity calibration sources. The calibration source generation sub-module 101 may obtain the DTC nonlinearity calibration sources by subtracting the accumulated quantization residual QE of the fractional frequency division ratio from a preset value and calculating m power of an obtained difference, where $m=(1, \ldots, n)$.

The calibration coefficient generation sub-module 102 is connected to the control word generation sub-module 103, and is configured to perform a calculation according to the n DTC nonlinearity calibration sources, the locked phase error, and the pre-configured nonlinear predistortion function to obtain calibration coefficients of respective calibration orders of the nonlinear predistortion function, with the calibration coefficients of the respective calibration orders of the nonlinear predistortion function in one-to-one correspondence with the n DTC nonlinearity calibration sources. The calibration coefficient generation sub-module 102 may obtain the calibration coefficients of the different orders of the DTC nonlinear predistortion function through iteration by taking data output by the calibration source generation sub-module 101 as the calibration sources and taking the phase error PHE locked by a PLL as an error source.

The control word generation sub-module 103 is configured to calculate the control word of the DTC according to the n DTC nonlinearity calibration sources and the calibration coefficients of the respective calibration orders of the nonlinear predistortion function. The control word generation sub-module 103 may obtain a control quantity of the DTC (i.e., the control word DTC_CTRL of the DTC) by performing a calculation according to the high-order calibration coefficients obtained by the calibration coefficient generation sub-module 102 and the calibration sources obtained by the calibration source generation sub-module 101. The control word DTC_CTRL of the DTC is configured to control a delay length of the DTC, so as to enable the DTC to adjust a phase of the reference clock to keep the reference clock and the feedback clock which are input to the TDC in the tracked state.

Specific structures of the calibration source generation sub-module 101, the calibration coefficient generation sub-module 102, and the control word generation sub-module 103 are described in detail below with reference to FIG. 7 to FIG. 9, respectively.

Figure 7:
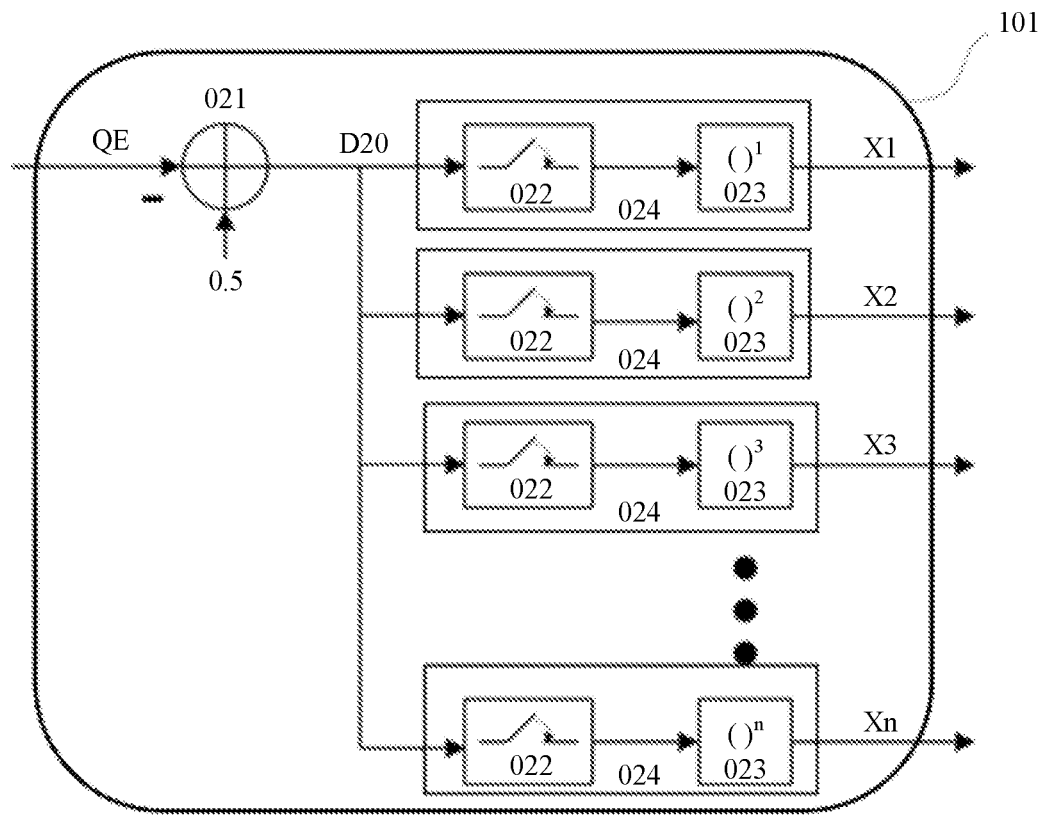
FIG. 7 is a schematic structural diagram of a calibration source generation sub-module according to the present disclosure.

FIG. 7 is a schematic structural diagram of a calibration source generation sub-module according to the present disclosure. As shown in FIG. 7, the calibration source generation sub-module 101 includes a subtractor 021 and n calibration source generation units 024. The subtractor 021 is connected to the n calibration source generation units 024, and is configured to calculate the difference between the preset value and the accumulated quantization residual QE of the fractional frequency division ratio.

The preset value may be 0.5, and the subtractor 021 is configured to calculate the difference D20 between the preset value and the accumulated quantization residual QE of the fractional frequency division ratio by D20=0.5−QE.

Each calibration source generation unit 024 includes a first data switch 022 and a calculation unit 023 connected to the first data switch 022. The calculation unit 023 is configured to calculate m power of the difference D20 when the first data switch 022 is closed, so as to obtain the DTC nonlinearity calibration source corresponding to the calibration source generation unit 024 where the calculation unit 023 is located; and for the different calibration source generation units 024, m takes different values, and m=(1, . . . , n). That is, if the first data switch 022 is closed, the subtractor 021 may output the difference D20 through the first data switch 022 to the calculation unit 023 connected thereto for the calculation unit 023 to calculate the corresponding DTC nonlinearity calibration source.

The calculation unit 023 in the first calibration source generation unit 024 is configured to calculate first power of the difference D20 to obtain X1, the calculation unit 023 in the second calibration source generation unit 024 is configured to calculate second power of the difference D20 to obtain X2, the calculation unit 023 in the third calibration source generation unit 024 is configured to calculate third power of the difference D20 to obtain X3, and so on, and the calculation unit 023 in the $n^{th}$ calibration source generation unit 024 is configured to calculate n power of the difference D20 to obtain Xn, thus obtaining the n DTC nonlinearity calibration sources X1 to Xn. It should be noted that all the calibration source generation units 024 can synchronously calculate the DTC nonlinearity calibration sources.

Figure 8:
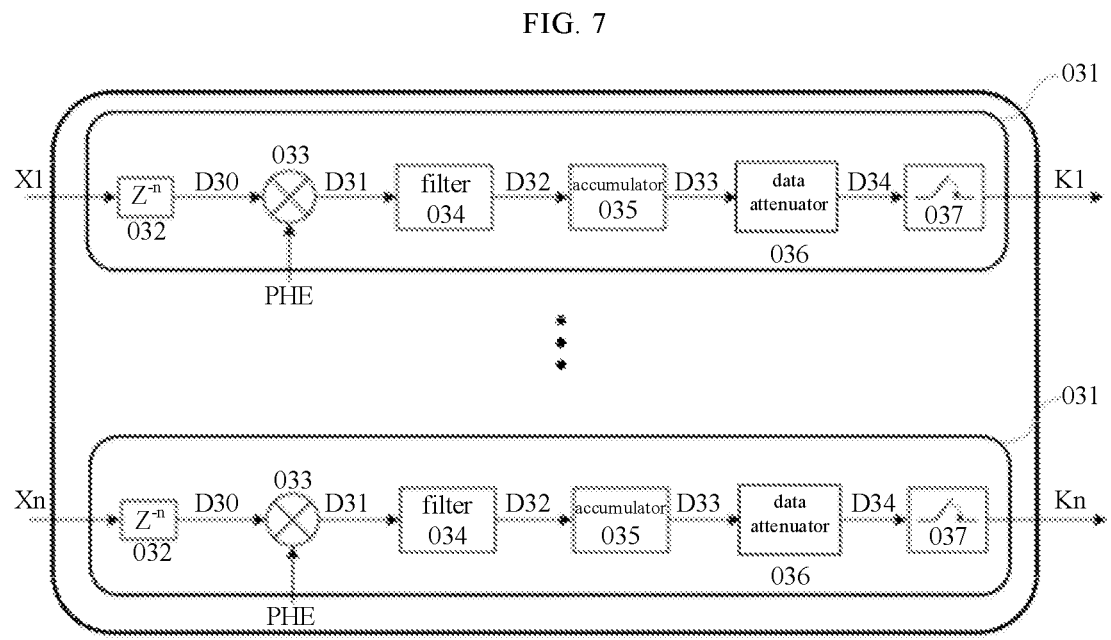
FIG. 8 is a schematic structural diagram of a calibration coefficient generation sub-module according to the present disclosure.

FIG. 8 is a schematic structural diagram of a calibration coefficient generation sub-module according to the present disclosure. As shown in FIG. 8, the calibration coefficient generation sub-module 102 includes n calibration coefficient generation units 031 each including a delay module 032, a multiplier 033, a filter 034, an accumulator 035, and a second data switch 037, which are connected in sequence. The DTC nonlinearity calibration sources X1 to Xn are input to the delay modules 032 of the calibration coefficient generation units 031 respectively, and each delay module 032 is configured to perform beating delay on the input DTC nonlinearity calibration source Xm to obtain a fifth data D30, and the number of beats is configured to ensure that the fifth data D30 is synchronized with a time sequence of the locked phase error PHE, where m=(1, . . . , n).

The multiplier 033 is configured to multiply the locked phase error PHE with the fifth data D30 to obtain a sixth data D31.

The filter 034 is configured to filter the sixth data D31 according to a filter coefficient, and extract a stable direct current component to obtain a seventh data D32. The filter 034 is an Infinite Impulse Response (IIR) filter.

The accumulator 035 is configured to accumulate the seventh data D32 of each clock cycle by an adaptive algorithm, make the nonlinear predistortion function to converge, and perform a calculation to obtain a calibration coefficient D33 of a corresponding calibration order of the nonlinear predistortion function.

The data switch 037 is configured to control whether to transmit data to a back stage.

The configuration module 2 is further configured to configure the filter coefficient for the filter 034.

Each calibration coefficient generation unit 031 may further include a data attenuator 036, which is connected to the accumulator 035 and the data switch 037 of the calibration coefficient generation unit 031, and is configured to perform, according to an attenuation coefficient, signal attenuation on the calibration coefficient output by the accumulator 035.

The configuration module 2 is further configured to configure the attenuation coefficient for the data attenuator 036.

The attenuation coefficients and the filter coefficients of the calibration coefficient generation sub-module 102 may be configured with the configuration module 2, so as to reach a compromise between a convergence speed and accuracy through parameter adjustment.

It should be noted that the data attenuator 036 may be implemented through right shifting (i.e., beating) of data, or by multiplying the data with a coefficient less than 1.

Figure 9:
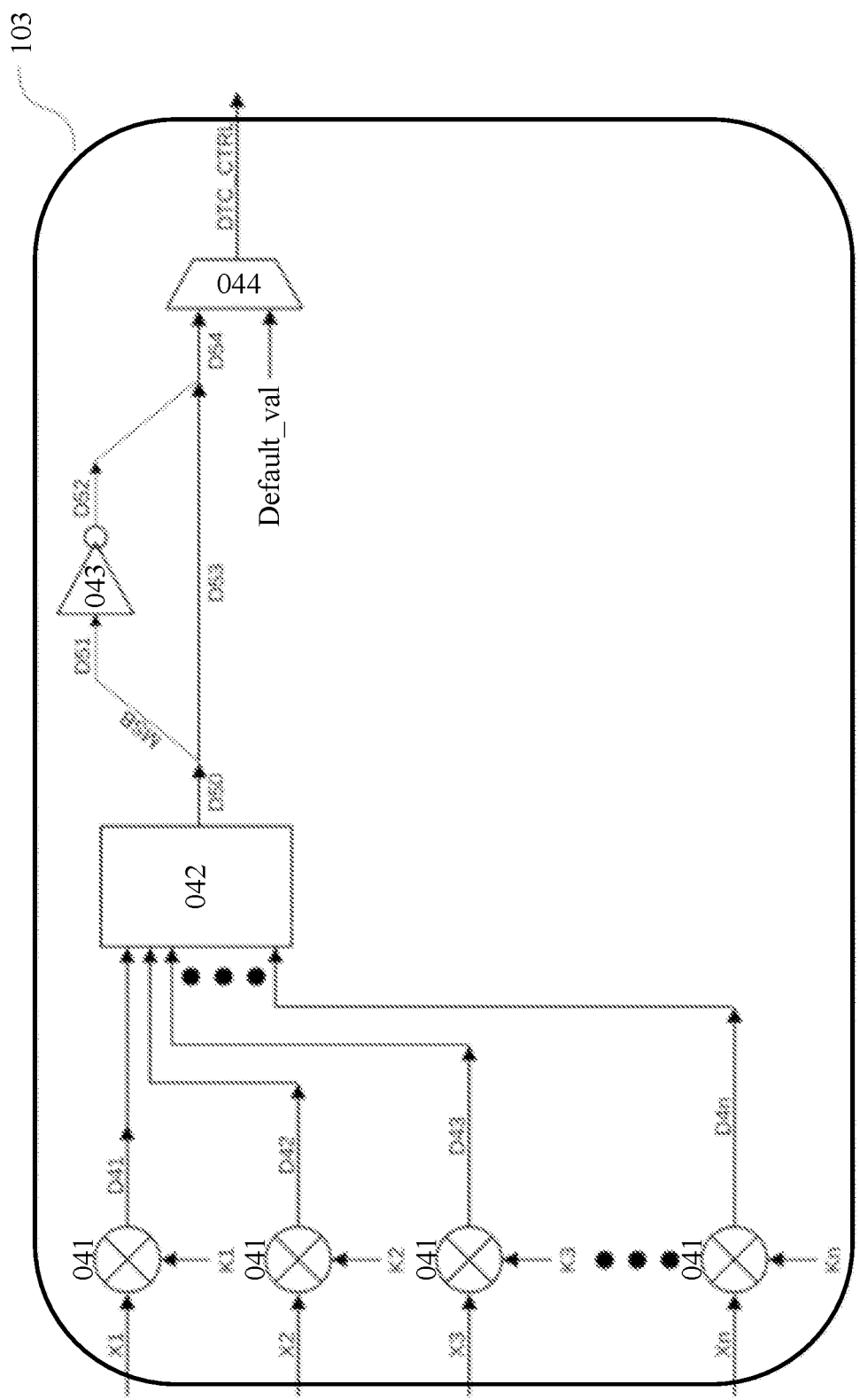
FIG. 9 is a schematic structural diagram of a control word generation sub-module according to the present disclosure.

FIG. 9 is a schematic structural diagram of a control word generation sub-module according to the present disclosure. As shown in FIG. 9, the control word generation sub-module 103 includes an adder 042, an inverter 043, a data selector 044, and n multipliers 041. Each multiplier 041 is respectively connected to an output terminal of one calibration source generation unit 024 in the calibration source generation sub-module 101 and an output terminal of the corresponding calibration coefficient generation unit 031 in the calibration coefficient generation sub-module 102, and is configured to multiply the DTC nonlinearity calibration source generated by the calibration source generation unit 024 with the calibration coefficient generated by the calibration coefficient generation unit 031 to obtain a product D41, D42, . . . , D4*n*. That is, the multiplier 041 connected to the first calibration source generation unit 024 multiplies the DTC nonlinearity calibration source X1 with the calibration coefficient K1 to obtain D41, the multiplier 041 connected to the second calibration source generation unit 024 multiplies the DTC nonlinearity calibration source X2 with the calibration coefficient K2 to obtain D42, and so on, and the multiplier 041 connected to the nth calibration source generation unit 024 multiplies the DTC nonlinearity calibration source Xn with the calibration coefficient Kn to obtain D4*n*.

The adder 042 is configured to add up the products (i.e., D41, D42, . . . , D4*n*) from the multipliers 041 to obtain the first data D50.

An input terminal of the inverter 043 is connected to an output terminal of the adder 042, and an output terminal of the inverter 043 is connected to an input terminal of the data selector 044. The inverter 043 is configured to invert a sign bit D51 of the first data D50 to obtain the second data D52. The second data D52 is used as a new sign bit used to be combined with the third data D53 obtained after removing the sign bit D51 from the first data D50 to obtain the fourth data D54. The fourth data D54 is input to the data selector 044. That is, an MSB of the first data D50 is taken as the sign bit D51, and the data remained after the sign bit D51 is removed from the first data D50 is D53. The inverter 043 inverts the sign bit D51 to obtain the second data D52. The second data D52 is combined with the third data D53 to obtain the fourth data D54 as an input to the data selector 044.

The data selector 044 is configured to determine the control word of the DTC according to the fourth data D54. The fourth data D54 and a preset threshold Default_val may be used as inputs to the data selector 044, and the data selector 044 performs data selection on the fourth data D54 and the preset threshold Default_val to obtain the control word DTC_CTRL of the DTC.

Figure 10:
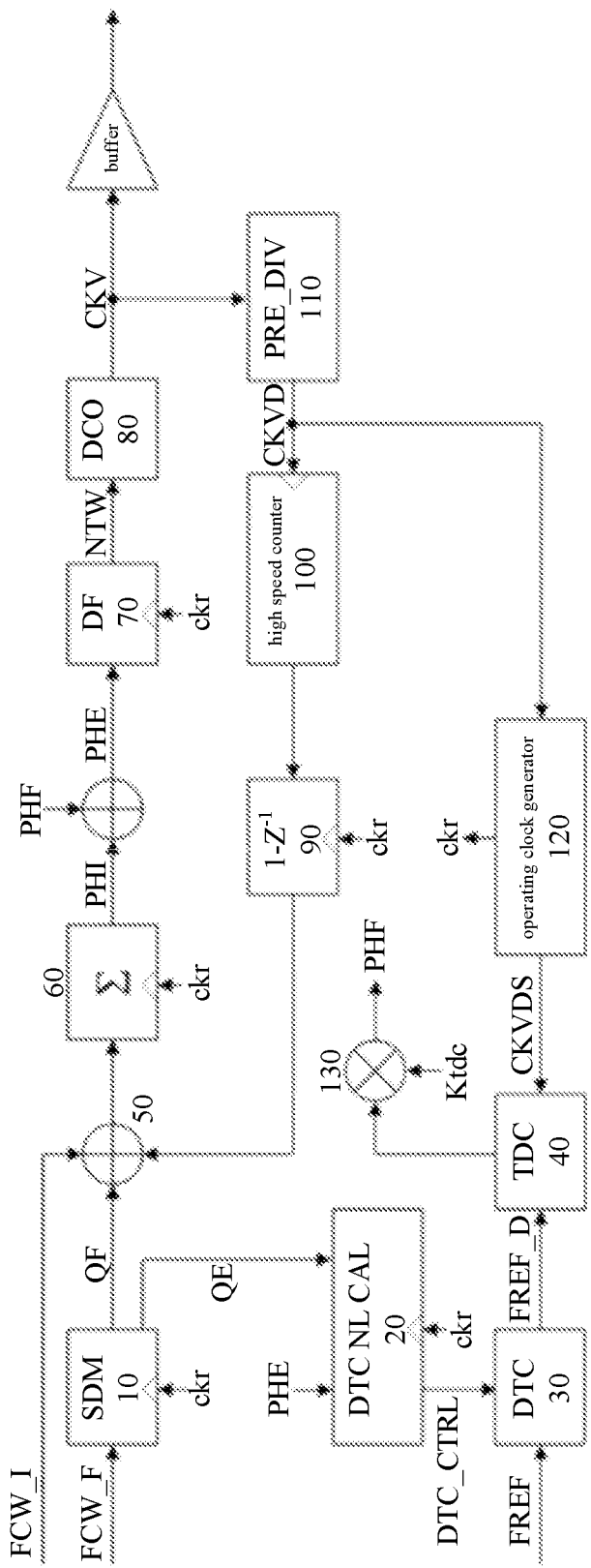
FIG. 10 is a schematic structural diagram of a DPLL according to the present disclosure.

The present disclosure further provides a DPLL. As shown in FIG. 10, the DPLL includes a quantization error accumulation device (i.e., SDM) 10, a linearity calibration apparatus for DTC (i.e., DTC NL CAL) 20, a DTC 30, and a TDC 40. The linearity calibration apparatus for DTC 20 is the linearity calibration apparatus for DTC according to the embodiments of the present disclosure. The linearity calibration apparatus for DTC 20 is connected to the quantization error accumulation device 10 and the DTC 30, and the TDC 40 is connected to the DTC 30. In the example illustrated by FIG. 10, the quantization error accumulation device 10 is a sigma-delta modulator (SDM).

The quantization error accumulation device 10 is configured to generate a phase prediction parameter according to an input fractional frequency division ratio.

The linearity calibration apparatus for DTC 20 is configured to calculate a control word DTC_CTRL of the DTC according to the phase prediction parameter, a locked phase error, a pre-configured nonlinear predistortion function, and a pre-configured calibration order n.

The DTC 30 is configured to adjust a delay of a reference clock according to the control word DTC_CTRL so as to keep the reference clock and a feedback clock which are input to the TDC 40 in a tracked state.

According to the DPLL provided by the present disclosure, by constructing a higher-order function to perform reverse compensation on the nonlinear predistortion function of an analog DTC, the DTC can be controlled to accurately adjust a phase of the reference clock, phase synchronization of the reference clock and the feedback clock can be kept, a mismatch of a phase adjustment value caused by nonlinearity of the DTC can be eliminated, and the problems of spurious and noise caused by the nonlinearity of the DTC can be suppressed; compared with a first-order piecewise fitting method, the nonlinear predistortion function has a faster convergence speed and can produce a better nonlinearity cancellation effect; and by adopting a full-digital predistortion method to analyze and compensate for the nonlinearity of the DTC, a design of an analog DTC circuit does not need to be improved, a complex digital-to-analog interface is avoided, the method is not sensitive to PVT changes, and high circuit reliability and consistency can be realized.

As shown in FIG. 10, the DPLL may further include an adder 50, an accumulator 60, a digital filter (DF) 70, a DCO 80, a delay module 90, a high speed counter 100, a pre-divider (PRE_DIV) 110, an operating clock generator 120, a multiplier 130, and other digital calibration circuit modules. The DTC 30 adjusts the delay of the reference clock according to the control word DTC_CTRL, and the TDC 40 sends out a phase difference PHF between the reference clock FREF and the feedback clock CKVD. When calibration on the DTC is not performed, the DPLL is in a frequency locked state, the locked phase error PHE fluctuates greatly. After the DTC is calibrated through nonlinear predistortion. phases of the reference clock FREF and the feedback clock CKVD are kept in a tracked and locked state, a value of the locked phase error PHE is stable and fluctuates slightly. and the DPLL can output clock signals with excellent spurious and phase noise performance.

Figure 11:
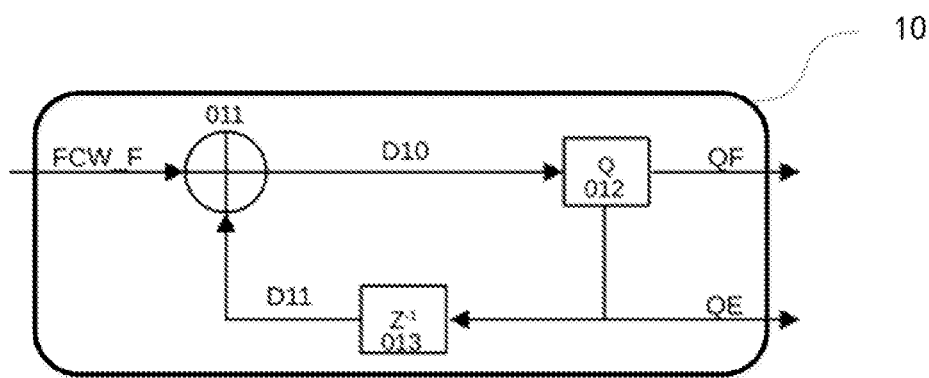
FIG. 11 is a schematic structural diagram of a quantization error accumulation module according to the present disclosure.

The phase prediction parameter may further include a quantized frequency division ratio QF of the fractional frequency division ratio. FIG. 11 is a schematic structural diagram of a quantization error accumulation module according to the present disclosure. As shown in FIG. 11, a main body of the quantization error accumulation module 10 may be an accumulator or a first-order SDM, and includes an adder 011, a carry quantizer 012, and a unit delay module 013. The adder 011 is configured to add an input fractional frequency division ratio FCW_F and a ninth data D11 to obtain an eighth data D10, with the ninth data D11 being output data of the unit delay module 013. The carry quantizer 012 is configured to perform a quantization process on the eighth data D10 to obtain the quantized frequency division ratio (i.e., a carry value) QF and the accumulated quantization residual QE of the fractional frequency division ratio. The unit delay module 013 is configured to perform beating delay on the accumulated quantization residuals QE of the fractional frequency division ratio to obtain the ninth data D11.

Based on the first-order SDM, the quantization error accumulation module 10 performs a quantization process on the input fractional frequency division ratio FCW_F. and outputs the quantized frequency division ratio QF and the accumulated quantization residual QE of the fractional frequency division ratio. The accumulated quantization residual QE represents a real-time phase relationship between the reference clock and the feedback clock, and may be used for delay control of the DTC.

The technical solutions of the present disclosure are described in detail below in conjunction with the example illustrated by FIG. 10.

Based on the DPLL shown in FIG. 10, the nonlinear predistortion function of the DTC set by simulation is $y=x^{\wedge}(1-x/300000)$, third-order nonlinear predistortion is adopted (that is, n=3), a clock frequency of the reference clock FREF of the DPLL is 122.88 MHz, an integer frequency division ratio PHI is 16, and the fractional frequency division ratio PHF is 0.1.

Figure 12:
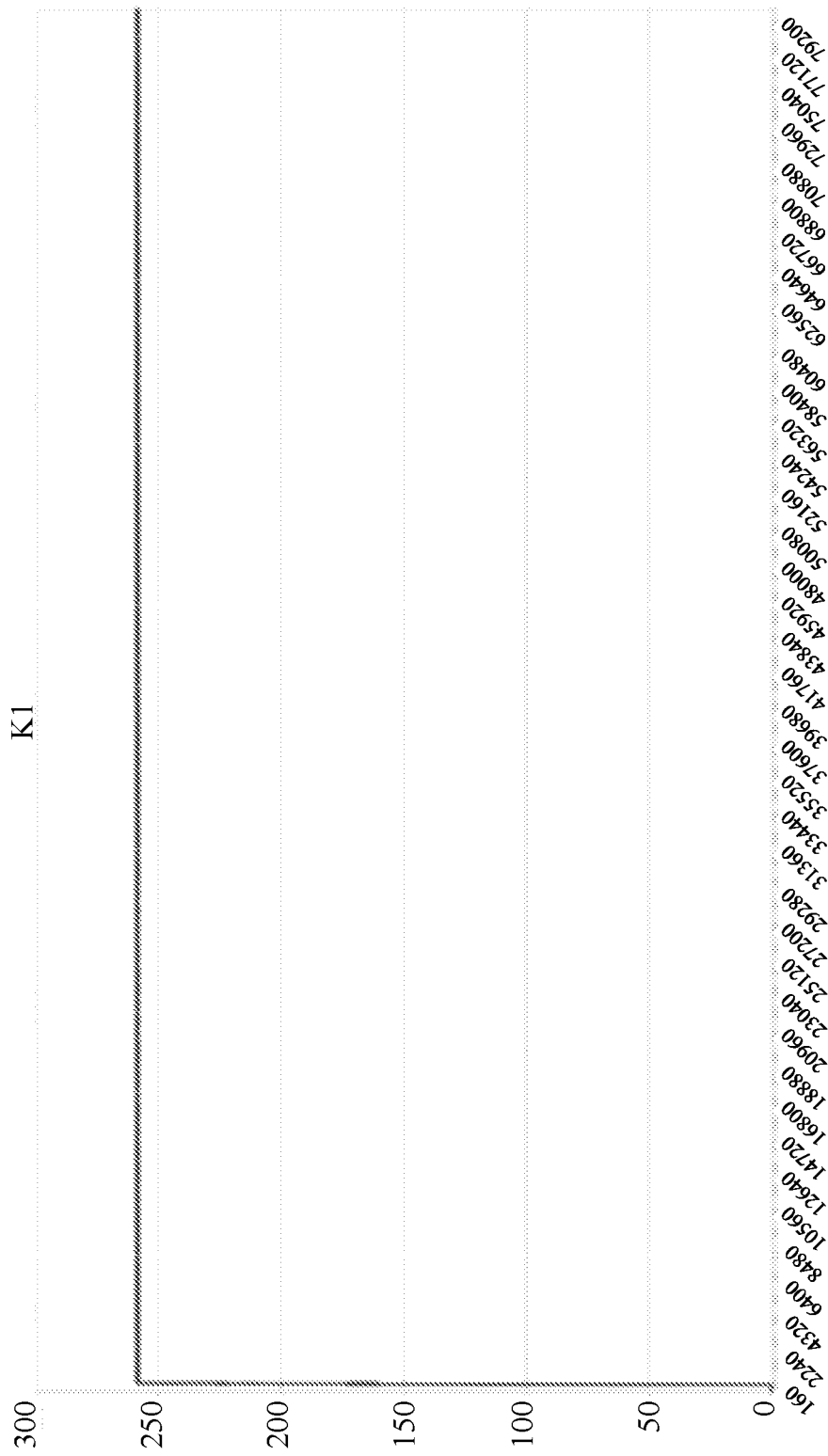
FIG. 12 is a schematic diagram of a calibration coefficient K1 according to the present disclosure.
Figure 13:
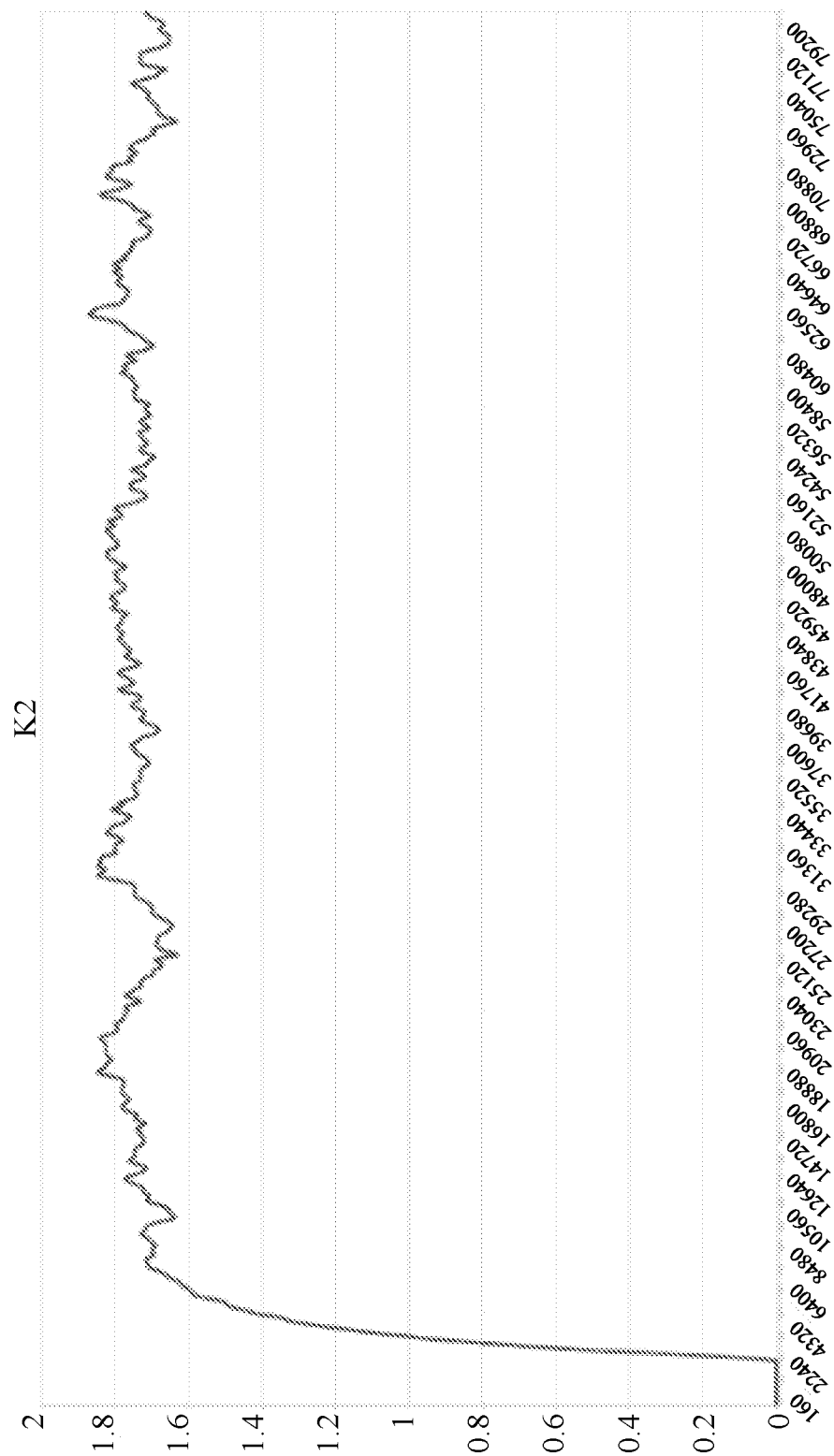
FIG. 13 is a schematic diagram of a calibration coefficient K2 according to the present disclosure.
Figure 14:
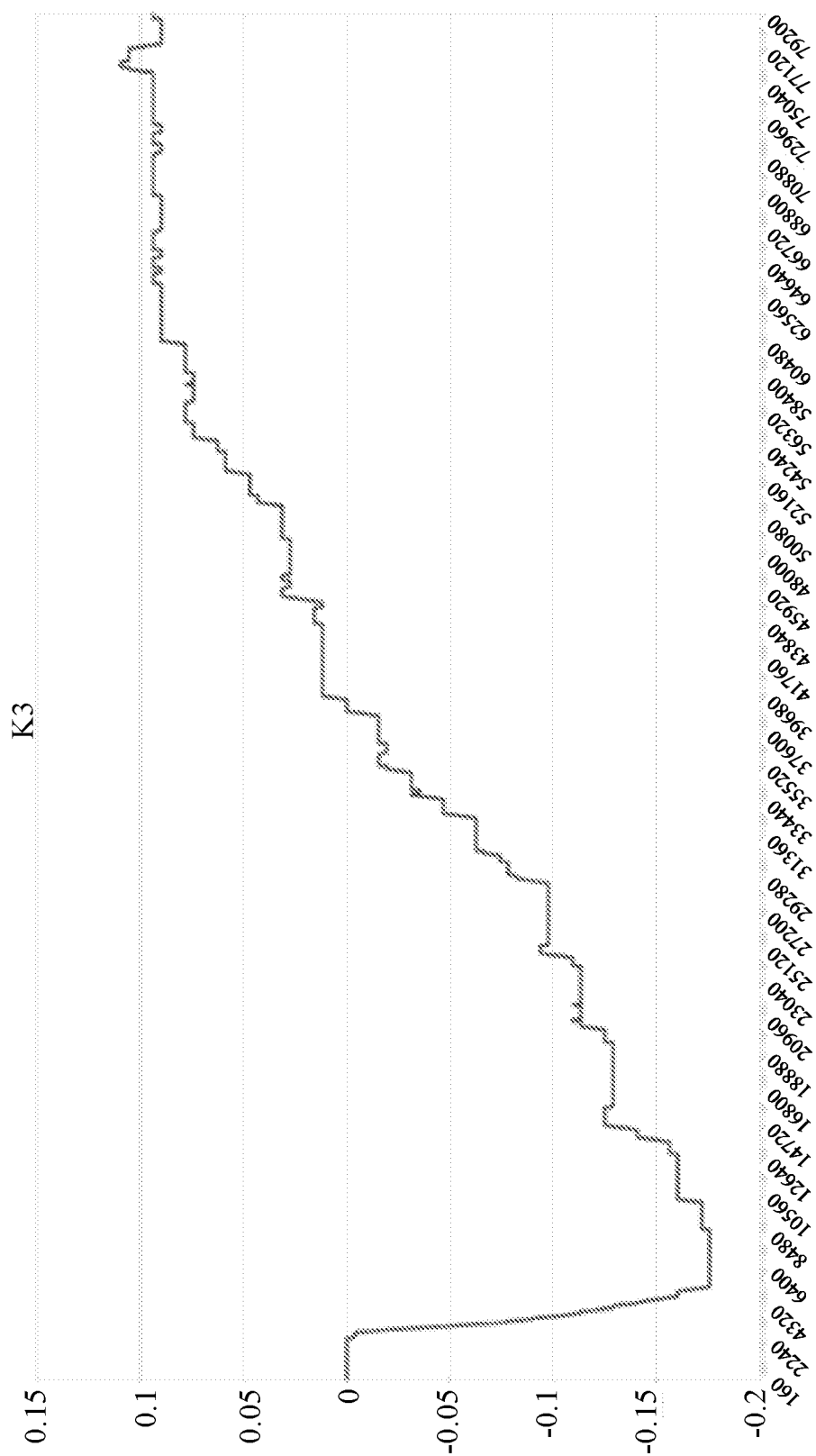
FIG. 14 is a schematic diagram of a calibration coefficient K3 according to the present disclosure.

The calibration coefficients K1 to K3 of the respective calibration orders obtained according to the technical solutions of the present disclosure are shown in FIG. 12, FIG. 13, and FIG. 14 respectively. FIG. 12 is a schematic diagram of the calibration coefficient K1, FIG. 13 is a schematic diagram of the calibration coefficient K2, and FIG. 14 is a schematic diagram of the calibration coefficient K3. Each of K1, K2, K3 reaches a steady state after converging for a period of time.

Figure 15:
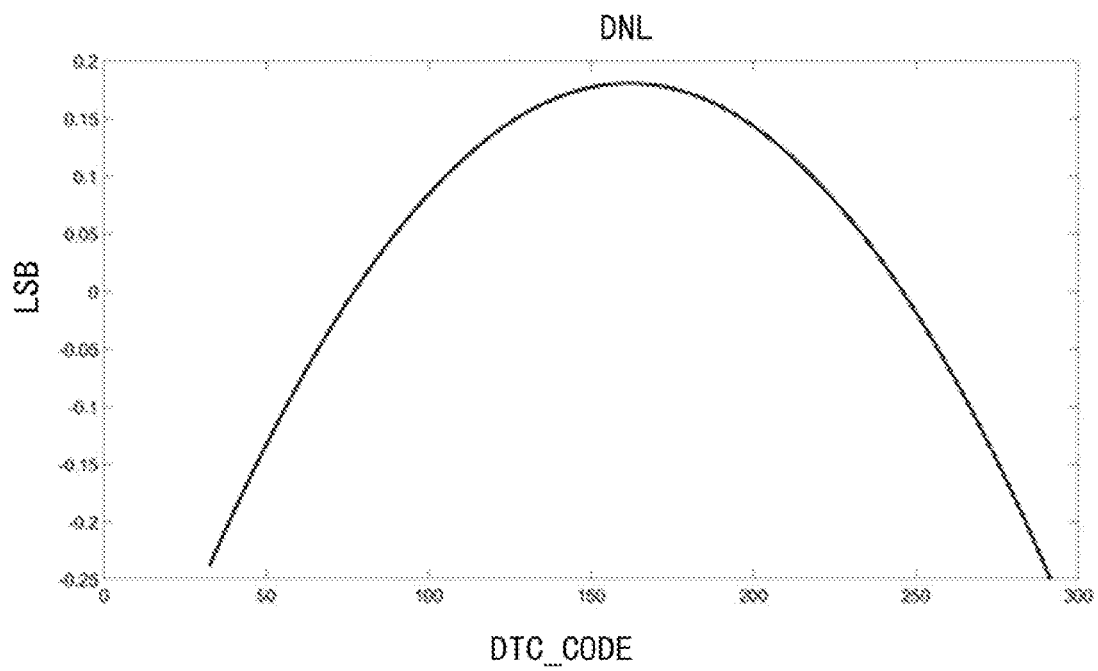
FIG. 15 is a differential nonlinearity curve graph in a case where linearity calibration of a DTC is not performed.
Figure 16:
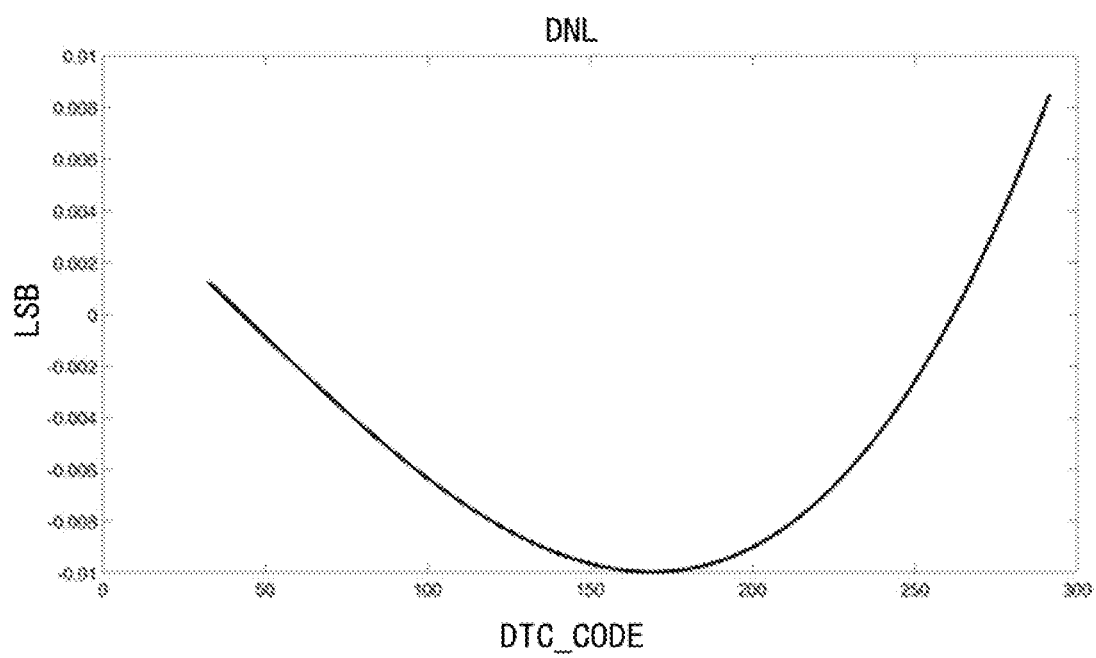
FIG. 16 is a differential nonlinearity curve graph after linearity calibration of a DTC is performed with the technical solutions of the present disclosure.

FIG. 15 is a DNL curve graph in a case where linearity calibration of a DTC is not performed, and FIG. 16 is a DNL curve graph after linearity calibration of a DTC is performed with the technical solutions of the present disclosure. As can be seen from comparison of FIG. 15 with FIG. 16, in the case where the linearity calibration of the DTC is not performed, the maximum DNL is 0.24 Least Significant Bit (LSB) in an entire dynamic range of the DTC. After the linearity calibration of the DTC is performed, the maximum DNL is 0.01 LSB in the entire dynamic range of the DTC, and equivalent linearity of the DTC is greatly improved.

In the present disclosure, the linearity calibration of the DTC is performed with the full-digital method, the method can be applied to the DPLL, all the technical solutions are insensitive to the PVT changes, and high circuit reliability and consistency can be realized. The background calibration method is adopted in the present disclosure, and can make a real-time response to an influence caused by changes of power supply voltage and temperature of a chip. Predistortion processing of the nonlinearity of the DTC performed in the present disclosure does not involve correction of linearity of the analog DTC circuit. and therefore, design difficulty of the DTC circuit is not increased and no extra digital-to-analog interface is added. The high-order nonlinear predistortion method is adopted in the present disclosure to compensate for the nonlinearity of the DTC, and compared with the first-order piecewise fitting method, the high-order nonlinear predistortion method has the advantages of faster convergence speed, better nonlinearity cancellation effect, faster response speed to the changes of power supply voltage and temperature, and lower calibration complexity.

It should be understood by those of ordinary skill in the art that the functional modules/units in all or some of the operations, and the devices in the methods disclosed above may be implemented as software, firmware, hardware, or suitable combinations thereof. If implemented as hardware, the division between the functional modules/units stated above is not necessarily corresponding to the division of physical components; for example, one physical component may have a plurality of functions, or one function or operation may be performed through cooperation of several physical components. Some or all of the physical components may be implemented as software executed by a processor. such as a central processing unit, a digital signal processor or a microprocessor, or may be implemented as hardware, or may be implemented as an integrated circuit, such as an application specific integrated circuit. Such software may be distributed on a computer-readable medium, which may include a computer storage medium (or a non-transitory medium) and a communication medium (or a transitory medium). As well known by those of ordinary skill in the art, the term "computer storage medium" includes volatile/nonvolatile and removable/non-removable media used in any method or technology for storing information (such as computer-readable instructions, data structures, program modules and other data). The computer storage medium includes, but is not limited to, a Random Access Memory (RAM), a Read-Only Memory (ROM), an Electrically Erasable Programmable Read-Only Memory (EEPROM), a flash memory or other memory techniques, a Compact Disc Read Only Memory (CD-ROM), a Digital Versatile Disc (DVD) or other optical discs, a magnetic cassette, a magnetic tape, a magnetic disk or other magnetic storage devices, or any other medium which can be configured to store desired information and can be accessed by a computer. In addition, it is well known by those of ordinary skill in the art that the communication media generally include computer-readable instructions, data structures, program modules, or other data in modulated data signals such as carrier wave or other transmission mechanism, and may include any information delivery medium.

The present disclosure discloses the exemplary embodiments using specific terms, but the terms are merely used and should be merely interpreted as having general illustrative meanings, rather than for the purpose of limitation. Unless expressly stated, it is apparent to those of ordinary skill in the art that features, characteristics and/or elements described in connection with a particular embodiment can be used alone or in combination with features, characteristics and/or elements described in connection with other embodiments. Therefore, it should be understood by those of ordinary skill in the art that various changes in the forms and the details can be made without departing from the scope of the present disclosure of the appended claims.

What is claimed is:

1. A linearity calibration method for a Digital Time Converter (DTC), comprising:

acquiring a phase prediction parameter and a locked phase error; and calculating a control word of the DTC according to the phase prediction parameter, the locked phase error, a pre-configured nonlinear predistortion function, and a pre-configured calibration order n, wherein the phase prediction parameter comprises an accumulated quantization residual of a fractional frequency division ratio, and the locked phase error is a sum of an integer phase difference between a reference clock and a feedback clock and a fractional phase difference between the reference clock and the feedback clock, and wherein n is an integer greater than or equal to 2, and the control word is configured to enable the DTC to adjust a delay of the reference clock so as to keep the reference clock and the feedback clock which are input to a Time Digital Converter (TDC) in a tracked state.

2. The method of claim 1, wherein calculating the control word of the DTC according to the phase prediction parameter, the locked phase error, the pre-configured nonlinear predistortion function, and the pre-configured calibration order n comprises:

performing a calculation according to the accumulated quantization residual of the fractional frequency division ratio and the pre-configured calibration order n to obtain n DTC nonlinearity calibration sources;

performing a calculation according to the n DTC nonlinearity calibration sources, the locked phase error, and the pre-configured nonlinear predistortion function to obtain calibration coefficients of respective calibration orders of the nonlinear predistortion function, wherein the calibration coefficients of the respective calibration orders of the pre-configured nonlinear predistortion function are in one-to-one correspondence with the n DTC nonlinearity calibration sources; and calculating the control word of the DTC according to the n DTC nonlinearity calibration sources and the calibration coefficients of the respective calibration orders of the pre-configured nonlinear predistortion function.

3. The method of claim 2, wherein performing a calculation according to the accumulated quantization residual of the fractional frequency division ratio and the pre-configured calibration order n to obtain the n DTC nonlinearity calibration sources comprises:

calculating a difference between a preset value and the accumulated quantization residual of the fractional frequency division ratio; and respectively calculating m power of the difference to obtain the n DTC nonlinearity calibration sources, wherein $m=(1, \ldots, n)$.

4. The method of claim 2, wherein performing a calculation according to the n DTC nonlinearity calibration sources, the locked phase error, and the pre-configured nonlinear predistortion function to obtain the calibration coefficients of the respective calibration orders of the nonlinear predistortion function comprises:

according to the n DTC nonlinearity calibration sources and the locked phase error, adopting an adaptive algorithm to make the nonlinear predistortion function to converge, and performing a calculation to obtain the calibration coefficients of the respective calibration orders of the nonlinear predistortion function.

5. The method of claim 2, wherein calculating the control word of the DTC according to the n DTC nonlinearity calibration sources and the calibration coefficients of the respective calibration orders of the nonlinear predistortion function comprises:
respectively multiplying the n DTC nonlinearity calibration sources with the calibration coefficients of the corresponding calibration orders, and adding up products to obtain a first data;
inverting a sign bit of the first data to obtain a second data, and combining the second data as a new sign bit with a third data obtained after removing the sign bit from the first data, so as to obtain a fourth data; and
determining the control word of the DTC according to the fourth data.

6. A linearity calibration apparatus for a Digital Time Converter (DTC), comprising a processing module and a configuration module,
the configuration module being configured to configure a nonlinear predistortion function and a calibration order n for the processing module, wherein n is an integer greater than or equal to 2; and
the processing module being configured to:
acquire a phase prediction parameter and a locked phase error, and
calculate a control word of the DTC according to the phase prediction parameter, the locked phase error, the configured nonlinear predistortion function, and the configured calibration order n,
wherein the control word is configured to enable the DTC to adjust a delay of a reference clock so as to keep the reference clock and a feedback clock which are input to a Time Digital Converter (TDC) in a tracked state.

7. The linearity calibration apparatus of claim 6, wherein the phase prediction parameter comprises an accumulated quantization residual of a fractional frequency division ratio, and the processing module comprises a calibration source generation sub-module, a calibration coefficient generation sub-module, and a control word generation sub-module,
the calibration source generation sub-module is connected to the calibration coefficient generation sub-module and the control word generation sub-module, and is configured to perform a calculation according to the accumulated quantization residual of the fractional frequency division ratio and the configured calibration order n to obtain n DTC nonlinearity calibration sources;
the calibration coefficient generation sub-module is connected to the control word generation sub-module, and is configured to perform a calculation according to the n DTC nonlinearity calibration sources, the locked phase error, and the configured nonlinear predistortion function to obtain calibration coefficients of respective calibration orders of the nonlinear predistortion function, wherein the calibration coefficients of the respective calibration orders of the nonlinear predistortion function are in one-to-one correspondence with the n DTC nonlinearity calibration sources; and
the control word generation sub-module is configured to calculate the control word of the DTC according to the n DTC nonlinearity calibration sources and the calibration coefficients of the respective calibration orders of the nonlinear predistortion function.

8. The linearity calibration apparatus of claim 7, wherein the calibration source generation sub-module comprises a subtractor and n calibration source generation units,
the subtractor is connected to the n calibration source generation units, and is configured to calculate a difference between a preset value and the accumulated quantization residual of the fractional frequency division ratio; and
each of the n calibration source generation units comprises a first data switch and a calculation unit connected to the first data switch, the calculation unit is configured to calculate m power of the difference when the first data switch is closed, so as to obtain a DTC nonlinearity calibration source corresponding to the calibration source generation unit where the calculation unit is located, the n calibration source generation units obtain the n DTC nonlinearity calibration sources respectively,
wherein for the different calibration source generation units, m takes different values, and m=(1, . . . , n).

9. The linearity calibration apparatus of claim 8, wherein the calibration coefficient generation sub-module comprises n calibration coefficient generation units, and each of the n calibration coefficient generation units comprises a delay module, a multiplier, a filter, an accumulator, and a second data switch, which are connected in sequence, the delay module is configured to perform beating delay on an input DTC nonlinearity calibration source to obtain a fifth data;
the multiplier is configured to multiply the locked phase error with the fifth data to obtain a sixth data;
the filter is configured to filter the sixth data according to a filter coefficient to obtain a seventh data;
the accumulator is configured to accumulate the seventh data of each clock cycle by an adaptive algorithm, make the nonlinear predistortion function to converge, and perform a calculation to obtain a calibration coefficient of a corresponding calibration order of the nonlinear predistortion function; and
the configuration module is further configured to configure the filter coefficient for the filter.

10. The linearity calibration apparatus of claim 9, wherein each of the n calibration coefficient generation units further comprises a data attenuator,
the data attenuator is connected to the accumulator and the second data switch of a calibration coefficient generation unit where the data attenuator is located, and is configured to perform, according to an attenuation coefficient, signal attenuation on the calibration coefficient output by the accumulator; and
the configuration module is further configured to configure the attenuation coefficient for the data attenuator.

11. The linearity calibration apparatus of claim 9, wherein the control word generation sub-module comprises an adder, an inverter, a data selector, and n multipliers,
each of the n multipliers is respectively connected to an output terminal of one calibration source generation unit in the calibration source generation sub-module and an output terminal of a corresponding calibration coefficient generation unit in the calibration coefficient generation sub-module, and is configured to multiply a DTC nonlinearity calibration source obtained by the one calibration source generation unit among the n DTC nonlinearity calibration sources with a calibration coefficient generated by the calibration coefficient generation unit;

the adder is configured to add up products from the n multipliers to obtain a first data;

an input terminal of the inverter is connected to an output terminal of the adder, an output terminal of the inverter is connected to an input terminal of the data selector, the inverter is configured to invert a sign bit of the first data to obtain a second data, wherein the second data is used as a new sign bit used to be combined with a third data obtained after removing the sign bit from the first data to obtain a fourth data, and the fourth data is input to the data selector; and the data selector is configured to determine the control word of the DTC according to the fourth data.

12. The apparatus of claim 10, wherein the control word generation sub-module comprises an adder, an inverter, a data selector, and n multipliers, each of the n multipliers is respectively connected to an output terminal of one calibration source generation unit in the calibration source generation sub-module and an output terminal of a corresponding calibration coefficient generation unit in the calibration coefficient generation sub-module, and is configured to multiply a DTC nonlinearity calibration source obtained by the one calibration source generation unit among the n DTC nonlinearity calibration sources with a calibration coefficient generated by the calibration coefficient generation unit;

the adder is configured to add up products from the n multipliers to obtain a first data;

an input terminal of the inverter is connected to an output terminal of the adder, an output terminal of the inverter is connected to an input terminal of the data selector, the inverter is configured to invert a sign bit of the first data to obtain a second data, wherein the second data is used as a new sign bit used to be combined with a third data obtained after removing the sign bit from the first data to obtain a fourth data, and the fourth data is input to the data selector; and the data selector is configured to determine the control word of the DTC according to the fourth data.

13. A digital phase lock loop, comprising a quantization error accumulation device, a Digital Time Converter (DTC), and a Time Digital Converter (TDC), and a linearity calibration apparatus for the DTC, wherein the linearity calibration apparatus for the DTC is connected to the quantization error accumulation device and the DTC, and the TDC is connected to the DTC, the quantization error accumulation device is configured to generate a phase prediction parameter according to an input fractional frequency division ratio;

the linearity calibration apparatus for the DTC is configured to;

configure a nonlinear predistortion function and a calibration order n for a processing module, wherein n is an integer greater than or equal to 2;

acquire the phase prediction parameter and a locked phase error, and calculate a control word of the DTC according to the phase prediction parameter, the locked phase error, the configured nonlinear predistortion function, and the configured calibration order n; and the DTC is configured to adjust a delay of a reference clock according to the control word so as to keep the reference clock and a feedback clock which are input to the TDC in a tracked state.

* * * * *